(12) United States Patent
Bornstein et al.

(10) Patent No.: US 7,618,894 B2
(45) Date of Patent: Nov. 17, 2009

(54) MULTI-STEP SELECTIVE ETCHING FOR CROSS-POINT MEMORY

(75) Inventors: Jonathan Bornstein, Cupertino, CA (US); Travis Byonghyop, San Jose, CA (US)

(73) Assignee: Unity Semiconductor Corporation

( * ) Notice: Subject to any disclaimer, the term of this patent is extended or adjusted under 35 U.S.C. 154(b) by 287 days.

(21) Appl. No.: 11/881,475

(22) Filed: Jul. 26, 2007

(65) Prior Publication Data
US 2009/0029555 A1    Jan. 29, 2009

(51) Int. Cl.
*H01L 21/465* (2006.01)
(52) U.S. Cl. .................. 438/695; 438/705; 438/717; 438/740; 438/742; 257/321.486
(58) Field of Classification Search ........... 257/E21.486
See application file for complete search history.

(56) References Cited

U.S. PATENT DOCUMENTS

| | | | |
|---|---|---|---|
| 6,277,762 B1 | 8/2001 | Hwang | |
| 6,838,389 B2 * | 1/2005 | Williams et al. | 438/714 |
| 6,919,168 B2 | 7/2005 | Hwang et al. | |
| 6,955,992 B2 | 10/2005 | Zhang et al. | |
| 7,169,623 B2 * | 1/2007 | Ditizio | 438/3 |
| 7,491,644 B2 * | 2/2009 | Vinet et al. | 438/669 |
| 2002/0190025 A1 * | 12/2002 | Naeem | 216/41 |
| 2007/0105390 A1 | 5/2007 | Oh | |
| 2008/0132075 A1 * | 6/2008 | Gil | 438/703 |
| 2009/0026441 A1 | 1/2009 | Cheung et al. | |
| 2009/0026442 A1 | 1/2009 | Cheung et al. | |
| 2009/0027976 A1 | 1/2009 | Brewer et al. | |

OTHER PUBLICATIONS

Francesco Fracassi et al., "Chemistry of Titanium Dry Etching in Fluorinated and Chlorinated Gases", Pure & Applied Chemistry, vol. 64, No. 5, pp. 703-707, 1992.
E. R. Parker, et al., "High-Aspect-Ratio Inductively Coupled Plasma Etching of Bulk Titanium for MEMS Applications", Proceedings of 206th Meeting of the ECS, Oct. 2004.
L. Hang, et al., "Thermal Oxidation Properties of TiNOx Materials for Solar Thermal Selective Surfaces", ISBN No. 0975065025, 2004.
K. P. Lee, et al., "Dry Etching to Form Submicron Features in CMR Oxides: PrBaCaMnO3 and LaSrMnO3", Dept. Materials Science and Engineering, Univ. Of Florida.
N. Negishi, et al., "Improvement of Dielectric Etching Process for ArF Resist", 2003 Dry Process International Symposium, pp. 287-292.

* cited by examiner

*Primary Examiner*—Stephen W Smoot

(57) ABSTRACT

Multi-step selective etching. Etching an unmasked region associated with each layer of a plurality of layers, the plurality of layers comprising a stack, wherein the unmasked region of each of the plurality of layers is etched while exposed to a temperature, a pressure, a vacuum, using a plurality of etchants, wherein at least one of the plurality of etchants comprises an inert gas and oxygen, wherein the etchant oxidizes the at least one layer that can be oxidized such that the etching stops, the plurality of etchants leaving substantially unaffected a masked region associated with each layer of the plurality of layers, wherein two or more of the plurality of layers comprises a memory stack, and preventing corrosion of at least one of the plurality of layers comprising a conductive metal oxide by supplying oxygen to the stack after etching the unmasked region without breaking the vacuum.

23 Claims, 15 Drawing Sheets

MULTI-STEP SELECTIVE ETCHING FOR CROSS-POINT MEMORY

FIELD OF THE INVENTION

The present invention relates generally to semiconductors and memory technology. More specifically, etching for integrated circuit device fabrication is described.

BACKGROUND

Memory (i.e., material used for data storage for electrical and electronic devices) is formed and fabricated using various types of material, such as metals, semiconductors, silicon dioxide, and others. Conventional fabrication process techniques for semiconductor-type memories typically use deposition of thin film materials on substrates (e.g., silicon wafers), which are then patterned etched away ("etched") using various types of etchants that are generated to create plasma. In some conventional techniques, etchants are injected, provided, or otherwise supplied into a vacuum chamber and energized using radio frequency (RF) power at certain frequency ranges to generate and sustain plasma for etching unmasked regions of deposited materials. However, as a substrate is moved from one chamber to another, such as those found coupled to a cluster tool, conventional solutions typically break (i.e., lose) vacuum, which can lead to oxygen out-diffusion and corrosion of memory material such as complex metal oxides (CMO). Conventional deposition and fabrication techniques typically rely upon developing memories that are often constrained by size and features, thus requiring more features to be formed on a smaller die size. However, conventional processes typically require larger die sizes in order to achieve greater functionality. Further, conventional techniques for etching materials can also result in damage with other surrounding or adjacent materials or layers.

In some conventional techniques, etchants that are typically used to etch away unmasked areas of memory material can cause problems such as oxygen out-diffusing. In some conventional physical etching techniques such as ion milling, unwanted redeposited particles can accumulate on the external surfaces (e.g., sides, walls) of memory, resulting in corrosion of materials such as CMO. Further, if a vacuum break occurs, ambient water and oxygen particles typically react with halogens resulting in the corrosion of CMO material.

There are continuing efforts to improve upon fabrication techniques.

BRIEF DESCRIPTION OF THE DRAWINGS

Various examples are disclosed in the following detailed description and the accompanying drawings.

DETAILED DESCRIPTION

Various examples may be implemented in numerous ways, including as a system, a process, an apparatus, or a series of program instructions on a computer readable medium such as a computer readable storage medium or a computer network where the program instructions are sent over optical, electronic, or other wired or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the embodiments has not been described in detail to avoid unnecessarily obscuring the description.

Fabricating memory may be performed using the described techniques to prevent oxygen out-diffusing, CMO corrosion, and others when fabricating cross-point memory such as that described in U.S. patent application Ser. No. 11/095,026, filed Mar. 30, 2005 and entitled "Memory Using Mixed Valence Conductive Oxides," hereby incorporated by reference in its entirety for all purposes, describes non-volatile third dimensional memory elements that can be arranged in a cross-point array. New memory structures are possible with the capability of this third dimensional memory array, which may be performed using selective etching, as described below. Using materials such as platinum (Pt), silicon dioxide ($SiO_2$) or oxide, titanium nitride (TiN), yttrium stabilized zirconium (YSZ), conductive metal oxide (CMO), tungsten (W), complex metal oxides (CMO) such as perovskites, and others, forming cross-point memory arrays such as those found in third dimensional memories may be performed using selective etching to identify and selectively form a memory stack (e.g., a set of vertically configured layers including CMO that are formed and etched to provide the memory material that allows for data to be stored based on how voltages are conducted through the material) using plasma etching. Further, selective etching may include treatment of a stack of thin-film layers using oxygen provided at high pressures without a preceding loss of vacuum.

Figure 1A:
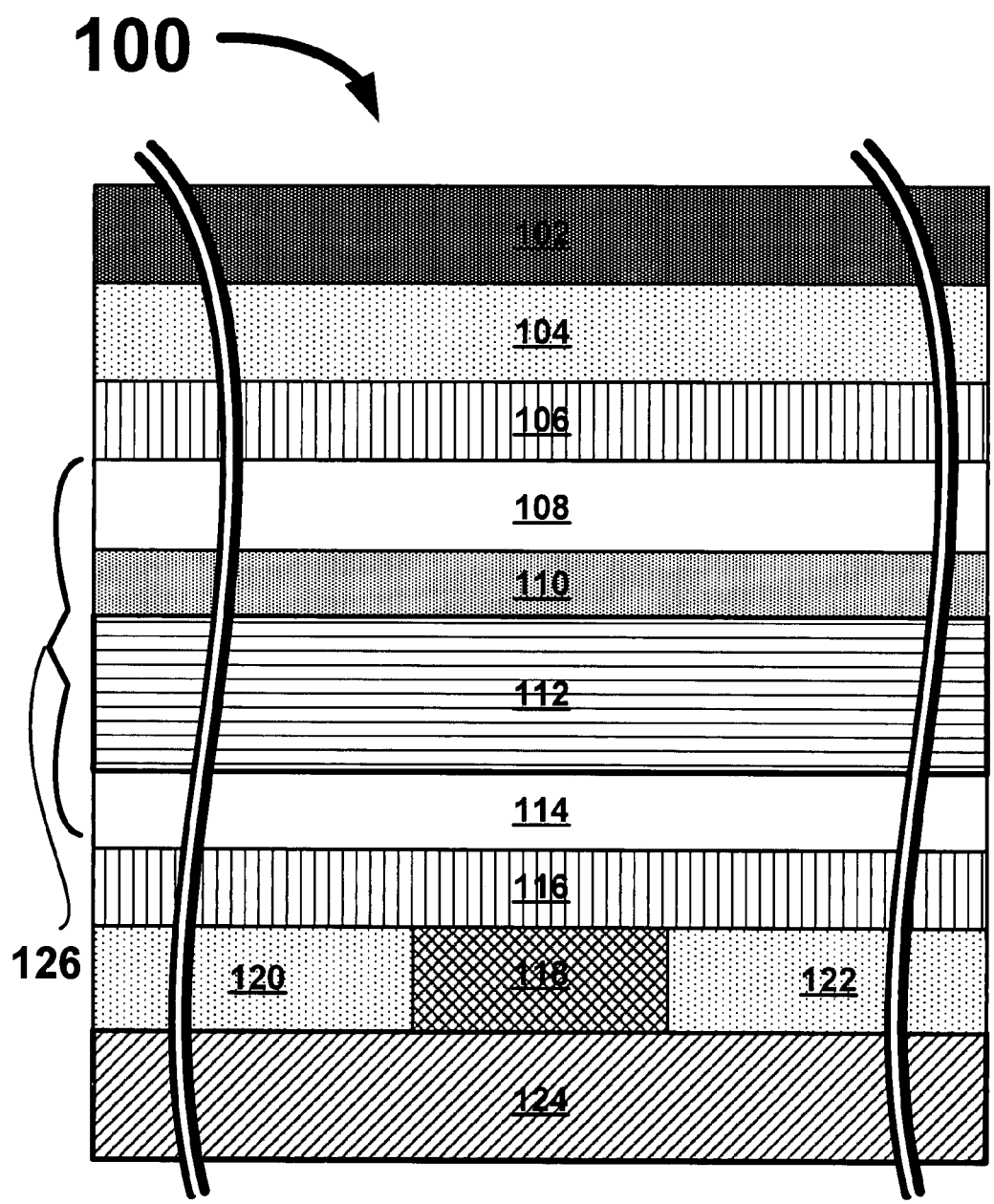
FIG. 1A is a cross-sectional view of an exemplary cross-point memory etched using selective etching.

FIG. 1A is a cross-sectional view of an exemplary cross-point memory etched using selective etching. Here, cross-point stack ("stack") 100 is shown with photoresist (PR) layer 102 and includes silicon dioxide (i.e., $SiO_2$) layer 104, titanium nitride (i.e., TiN) layer 106, platinum (i.e., Pt) layer 108, yttrium stabilized zirconium (i.e., YSZ) layer 110, CMO layer 112, platinum (i.e., Pt) layer 114, titanium nitride (i.e., TiN) layer 116, tungsten (i.e., W) sub-region 118, oxide/dielectric sub-regions 120-122, and substrate 124. It should be noted that the composition, thickness, and quantity of thin film layers shown (i.e., layers 102-124) may be varied and are not limited to any specific width, thickness, or dimension. Further, platinum layer 108, yttrium stabilized zirconium layer 110, CMO layer 112, platinum layer 114 form memory stack 126. In some examples, memory stack 126 may be used to implement a third dimensional memory array, such as that described in U.S. patent application Ser. No. 11/095,026, which is herein incorporated by reference for all purposes. As used herein, photoresist layer 102, silicon dioxide 104, titanium nitride 106, platinum layer 108, yttrium stabilized zirconium layer 110, CMO layer 112, platinum layer 114, titanium nitride layer 116, and tungsten sub-region 118 may also be referred to as "layers" and may also be referenced by chemical compound formulae.

Layers 102-122 may be formed on substrate 124, using plasma etchants, as described herein, to etch away unwanted material to form a stack of thin-film materials, including memory stack 126. In some examples, photoresist layer 102 may include photoresistive materials used to form a pattern for a desired geometry on stack 100. $SiO_2$ may be used as a hard mask to form silicon dioxide layer 104, which may be formed directly or indirectly below photoresist layer 102. TiN (titanium nitride) can be used to form titanium nitride layers 106 and 116, which may be located directly or indirectly below silicon dioxide layer 104 and platinum layer 114, respectively. In some examples, platinum layer 108, yttrium stabilized zirconium layer 110, CMO layer 112, and platinum layer 114 may be implemented and collectively referred to as memory stack 126. Here, YSZ may be used as an insulator configured to separate CMO from, for example, a top electrode such as platinum layer 108. YSZ also works as an oxygen reservoir to store oxygen ions from perovskite materials such as PrCaMnO (i.e., "PCMO"), which is a complex metal oxide ("CMO") material that allows oxygen ions to move freely in and out of the composition. Further, titanium nitride layer 116 may be used as a "glue" layer for stack 100, as used between platinum layer 114 and tungsten sub-region 118. In some examples, tungsten sub-region 118 may be implemented as a sub-region of layer 128, which may also comprise other sub-regions (e.g., oxide/dielectric sub-regions 120-122), which are adjacent to tungsten sub-region 118. As an example, oxide/dielectric sub-regions 120-122 may be implemented adjacent to tungsten sub-region 118. In other examples, stack 100 and the above-described elements may be varied in materials, design, formation, process, and are not limited to the descriptions provided.

Here, after photoresist layer 102 is formed and developed, a first etch may be performed to etch silicon dioxide layer 104. Unmasked portions or regions ("regions") of silicon dioxide layer 104 may be etched away while leaving masked regions. In some examples, titanium nitride layers 106 and 116 may be used as an etch stop layer. For example, titanium nitride layer 106 may be used as an etch stop layer for a first etch (i.e., etching away silicon dioxide layer 104). After completing the first etch, photoresist layer 102 may be removed using techniques such as those described herein. In other examples, stack 100 and the above-described elements and processes may be varied in material, dimensions, configuration, implementation, and other aspects and are not limited to those shown and described.

Figure 1B:
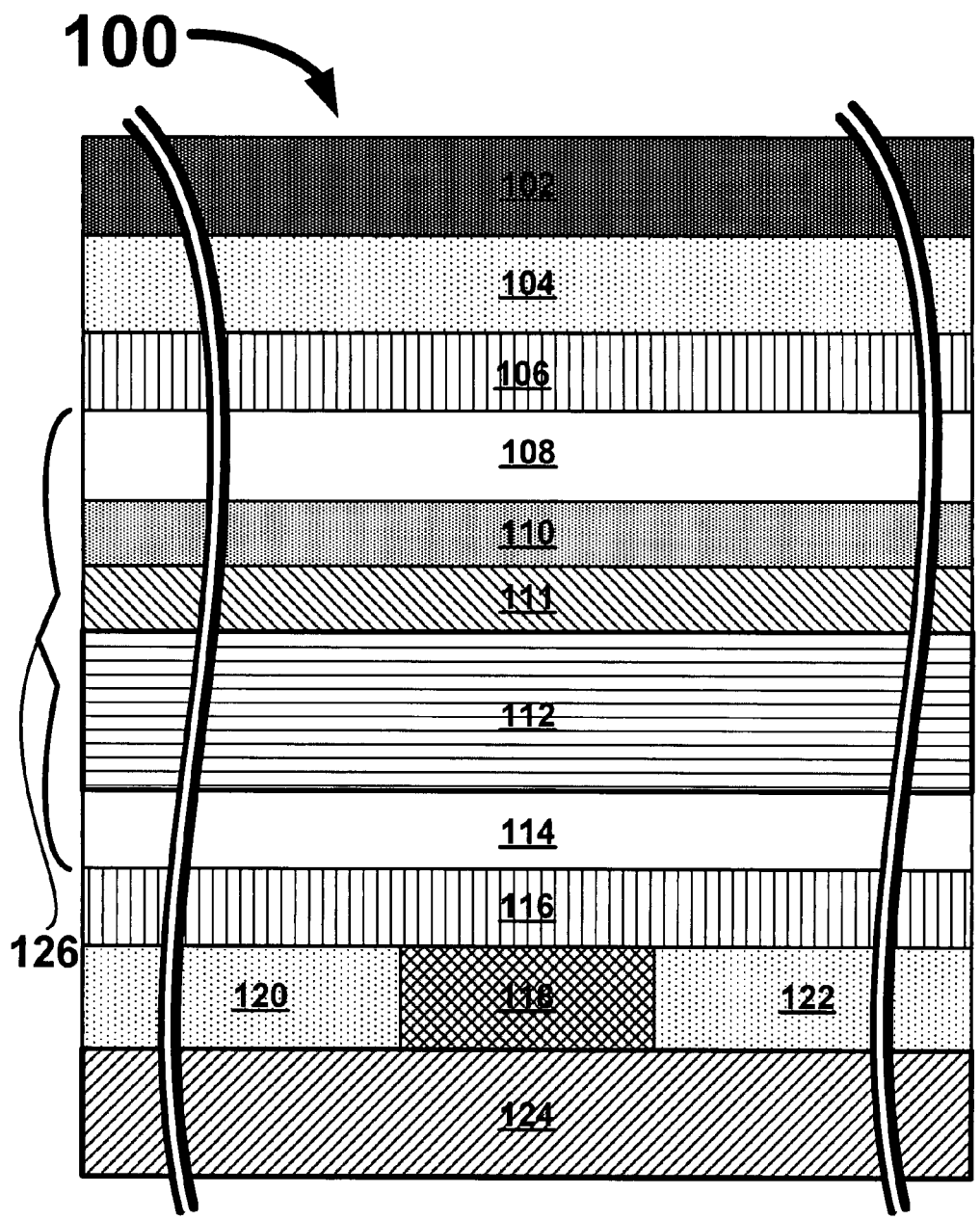
FIG. 1B is an alternative cross-sectional view of an exemplary cross-point memory etched using selective etching.

FIG. 1B is an alternative cross-sectional view of an exemplary cross-point memory etched using selective etching. Here, stack 100 is shown with photoresist layer 102 and includes silicon dioxide layer 104, titanium nitride layer 106, platinum layer 108, yttrium stabilized zirconium layer 110, CMO layer 112, platinum layer 114, titanium nitride layer 116, tungsten sub-region 118, oxide/dielectric sub-regions 120-122, and substrate 124. Alternatively, strontium titanate $SrTiO3$ (i.e., "STO") layer 111 may also be deposited or formed between yttrium stabilized zirconium (i.e., YSZ) layer 110 and CMO layer 112 to act as an ion barrier to prevent the escape of oxygen ions from CMO layer 112. It should be noted that the composition, thickness, and quantity of thin film layers shown (i.e., layers 102-124) may be varied and are not limited to any specific width, thickness, or dimension. Further, platinum layer 108, yttrium stabilized zirconium layer 110, CMO layer 112, platinum layer 114 form memory stack 126.

In some examples, a thin-film layer of a barrier to mobile oxygen ions may be optionally positioned between and in contact with CMO layer 112, which may be implemented using PCMO, and the tunnel barrier layer (e.g., YSZ). The ion barrier layer is operative to improve data retention in a memory element using stack 100. Suitable materials for an ion barrier layer (i.e., strontium titanate layer 111) may include, but is not limited to a perovskite material, such as strontium titanate, $SrTiO3$ (i.e., "STO"). In other examples, different materials may be used and are not limited to the example shown and described. In other words, strontium titanate layer 111 acts as an ion barrier and may be implemented using materials and compounds other than strontium titanate. In other examples, stack 100 and the above-described elements and processes may be varied in material, dimensions, configuration, implementation, and other aspects and are not limited to those shown and described.

Figure 2A:
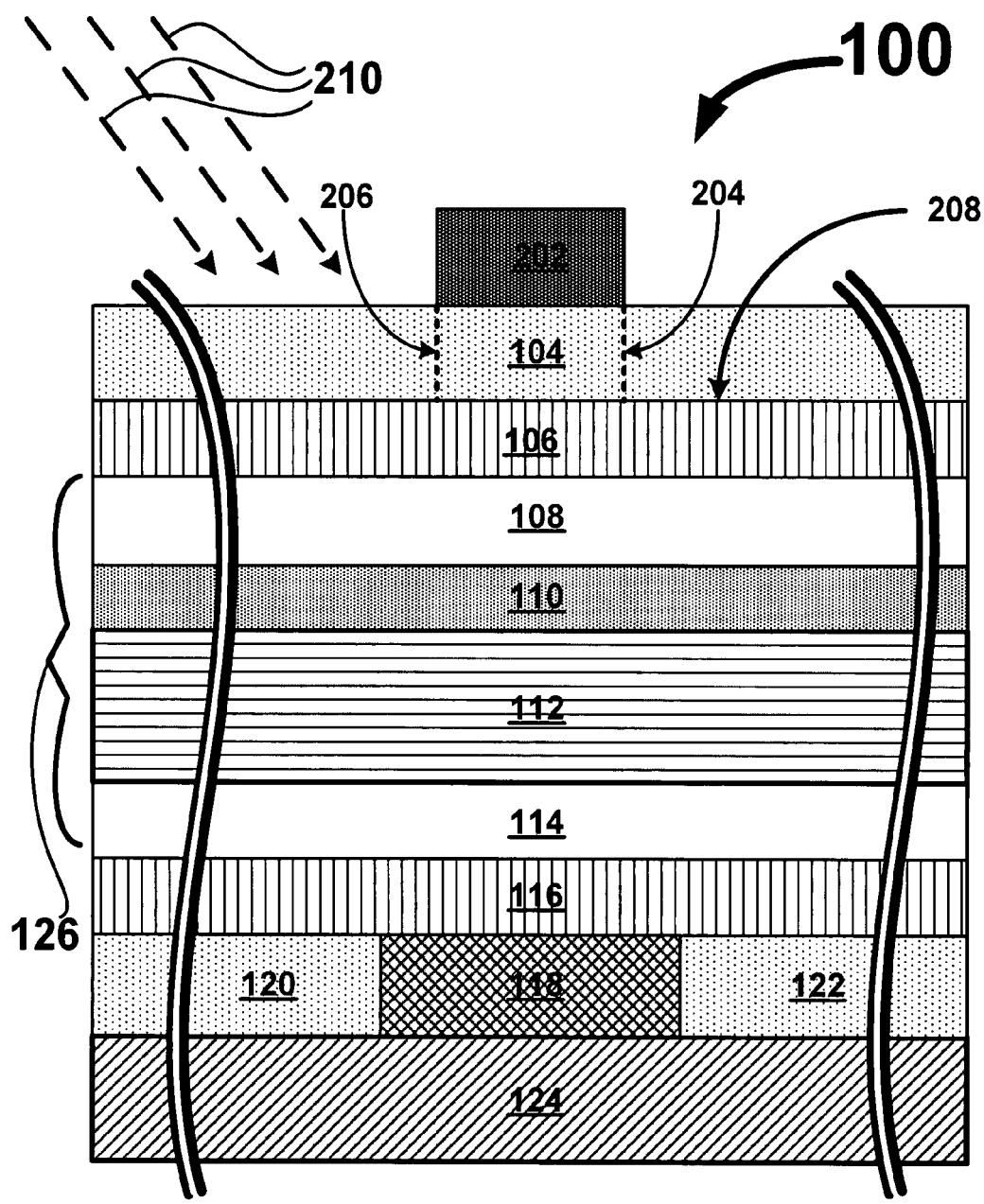
FIG. 2A is a cross-sectional view of a cross-point memory undergoing an exemplary etch in a selective etching process.

FIG. 2A is a cross-sectional view of a cross-point memory undergoing an exemplary etch in a selective etching process. Here, stack 100 is shown with photoresist mask 202 and includes silicon dioxide layer 104, titanium nitride layer 106, platinum layer 108, yttrium stabilized zirconium layer 110, CMO layer 112, platinum layer 114, titanium nitride layer 116, tungsten sub-region 118, oxide/dielectric sub-regions 120-122, and substrate 124. The composition, thickness, and quantity of thin film layers shown (i.e., layers 102-124) may be varied and are not limited to any specific width, thickness, or dimension. Further, platinum layer 108, yttrium stabilized zirconium layer 110, CMO layer 112, platinum layer 114 form memory stack 126. In some examples, the above-described layers 102-122 and substrate 124 may be varied in material, dimensions, configuration, implementation, and other aspects and are not limited to those shown and described.

In some examples, photoresist layer 102 (FIGS. 1A-1B) may be removed using material 210 using various techniques. For example, photoresist layer 102 may be removed using ashing or stripping processes. Ashing is a plasma process, whereas stripping can be a wet process in which a solvent is used to remove photoresistive material from a hard mask (i.e., silicon dioxide layer 104). In other examples, photoresist layer 102 may be removed differently, using different materials and processes apart from those shown and described.

Here, when photoresist layer 102 is removed and photoresist mask 202 is left, etchant 210 may be applied to pattern 204-206 on silicon dioxide layer 104, stopping at etch stop 208. An underlying oxide hard mask (i.e., silicon dioxide layer 104) may be etched using etchant 210, which may be gaseous compounds such as CF4 or CHF3/Ar that are used to plasma etch silicon dioxide layer 104. Photoresist mask 202 protects underlying silicon dioxide from being etched up to boundaries identified by pattern 204-206. After etching a hard mask (i.e., silicon dioxide layer 104), photoresist mask 202 may be stripped using a combination of dry and wet stripping processes. In other examples, stack 100 and the above-described elements and processes may be varied in material, dimensions, configuration, implementation, and other aspects and are not limited to those shown and described.

Figure 2B:
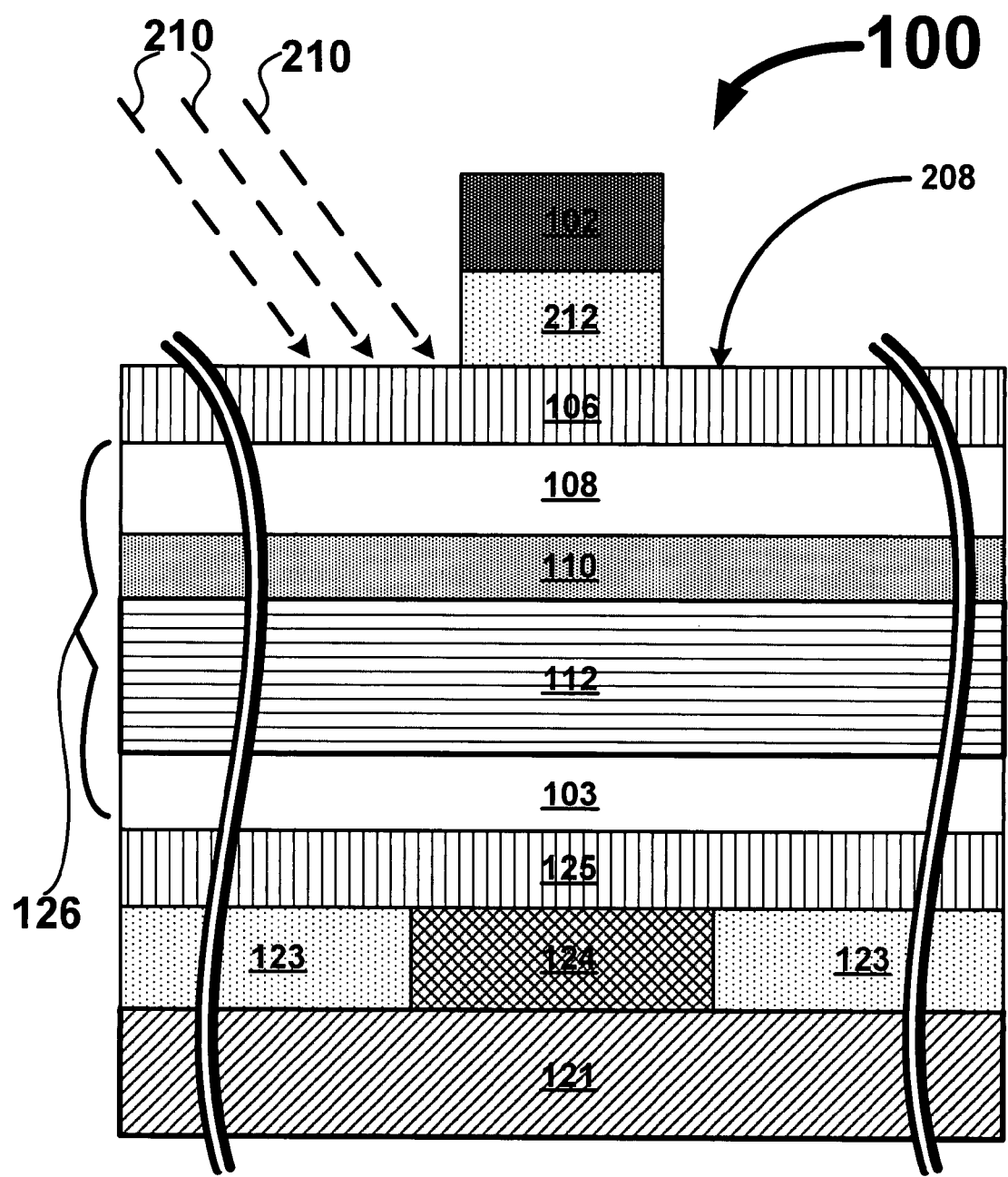
FIG. 2B is a further cross-sectional view of a cross-point memory undergoing an exemplary etch in a selective etching process.

FIG. 2B is a further cross-sectional view of a cross-point memory undergoing an exemplary etch in a selective etching process. Here, stack 100 is shown with photoresist mask 202 and includes titanium nitride layer 106, platinum layer 108, yttrium stabilized zirconium layer 110, CMO layer 112, platinum layer 114, titanium nitride layer 116, tungsten sub-region 118, oxide/dielectric sub-regions 120-122, and substrate 124. Also included in stack 100 is silicon dioxide layer 212, which has been etched to parameters specified by pattern 204-206 (FIG. 2A) and etch stop 208 (FIG. 2A) using etchant 210. The composition, thickness, and quantity of thin film layers shown (i.e., layers 102-124) may be varied and are not limited to any specific width, thickness, or dimension. Further, platinum layer 108, yttrium stabilized zirconium layer 110, CMO layer 112, platinum layer 114 form memory stack 126. In some examples, the above-described layers 102-122 and substrate 124 may be varied in material, dimensions, configuration, implementation, and other aspects and are not limited to those shown and described. After etching silicon dioxide layer 104 and leaving behind silicon dioxide layer 212, photoresist mask 202 may be stripped using a combination of dry and wet stripping processes. In other examples, stack 100 and the above-described elements and processes may be varied in material, dimensions, configuration, implementation, and other aspects and are not limited to those shown and described.

Figure 3A:
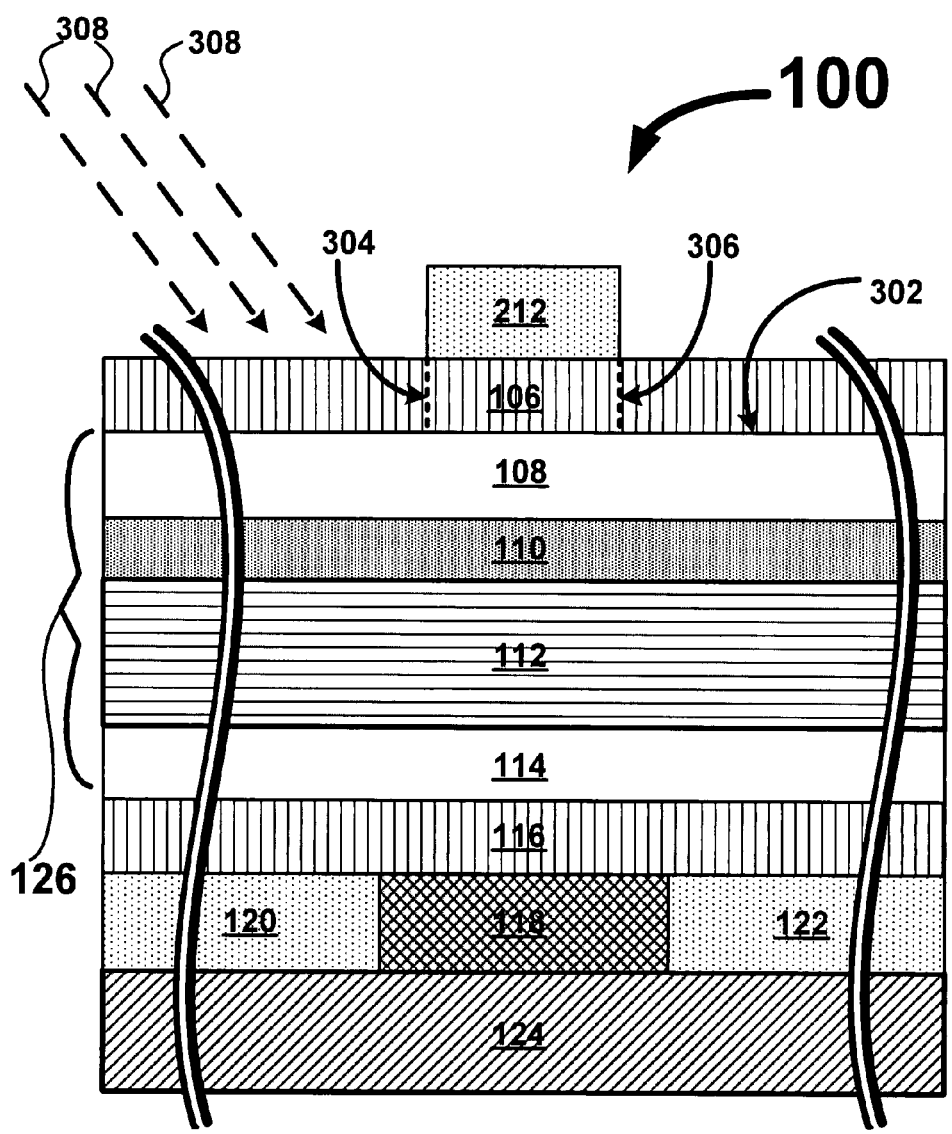
FIG. 3A is a cross-sectional view of a cross-point memory undergoing another exemplary etch in a selective etching process.

FIG. 3A is a cross-sectional view of a cross-point memory undergoing another exemplary etch in a selective etching process. Here, stack 100 includes titanium nitride layer 106, platinum layer 108, yttrium stabilized zirconium layer 110, CMO layer 112, platinum layer 114, titanium nitride layer 116, tungsten sub-region 118, oxide/dielectric sub-regions 120-122, substrate 124, and silicon dioxide layer 212. Further, platinum layer 108, yttrium stabilized zirconium layer 110, CMO layer 112, platinum layer 114 form memory stack 126. After removing photoresist mask 202, stack 100 may be further etched by applying an etchant to titanium nitride layer 106. Boundaries for etching titanium nitride layer 106 are specified by pattern 304-306 and etch stop 302. In some examples, etchant 308 may be used in a plasma etching process to remove unwanted material from titanium nitride layer 106.

Figure 3B:
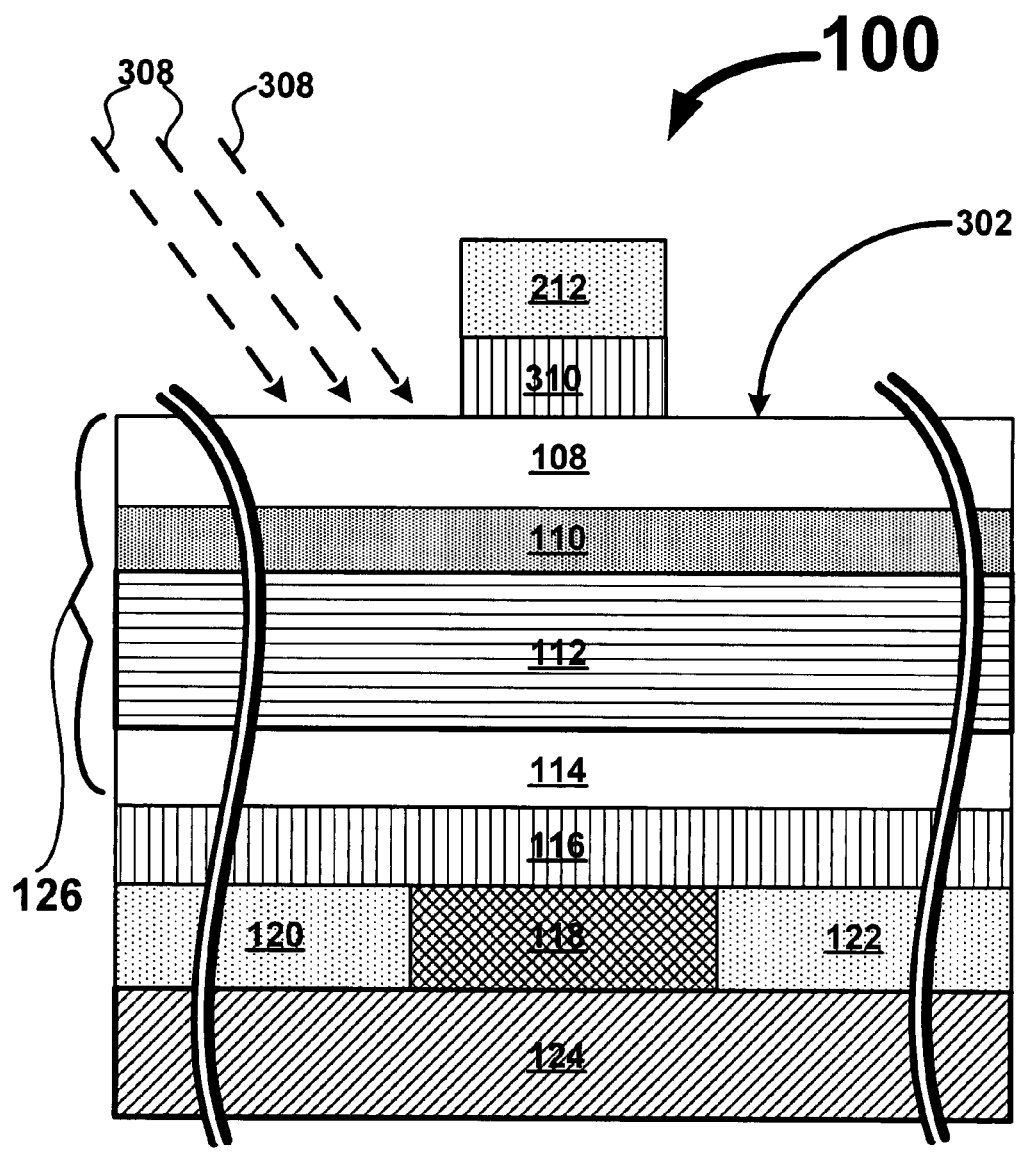
FIG. 3B is a further cross-sectional view of a cross-point memory undergoing another exemplary etch in a selective etching process.

In some examples, titanium nitride layer 106 may be etched using etchants such as those used in plasma etching (i.e., "etching"). Here, etchant 308 may be a plasma etchant used to selectively etch the unmasked region (i.e., as determined by pattern 304-306 and etch stop 302) of titanium nitride layer 106. Platinum layer 108 acts as an etch stop for the second etch. In some examples, etchant 308 has a $Cl_2$/Ar (chlorine/argon) chemistry and a high selectivity to silicon dioxide layer 212. Other types of selective plasma etchants used for etchant 308 may be HBr/Ar (hydrogen bromide/argon), HBr, or $Cl_2$. In some examples, $Cl_2$ may be supplied at a flow rate of about 10 sccm (standard cubic centimeters per minute) and Ar may be supplied at a flow rate of about 40 sccm. The plasma etching may be performed at a pressure of approximately 5 milliTorr, power of about 500 W in high frequency and about 50 W in low frequency, for a duration of approximately 30 seconds at an etch temperature of about 30 degrees Celsius. As an example, power used to excite provided gases (e.g., $Cl_2$/Ar) may be 1100 W at a "high" frequency of 13.56 MHz and 250 W at a "low" frequency of 450 KHz. As another example, power may be provided in the range of 100 W to 1200 W at high frequency (i.e., 13.56 MHz) and 10 W to 500 W at low frequency (i.e., 450 KHz). In still other examples, different power levels and frequencies may be used and are not limited to the examples provide and described herein. It should be noted that the flow rates of $Cl_2$/Ar, pressure, power, duration, and temperature may vary (e.g., temperature of the plasma (i.e., etchant 308) may be varied from 0 degrees to 500 degrees Celsius). FIG. 3B shows a cross-sectional view of the resulting structure after the second etch. In other examples, stack 100 and the above-described elements and processes may be varied in material, dimensions, configuration, implementation, and other aspects and are not limited to those shown and described.

FIG. 3B is a further cross-sectional view of a cross-point memory undergoing another exemplary etch in a selective etching process. Here, stack 100 includes platinum layer 108, yttrium stabilized zirconium layer 110, CMO layer 112, platinum layer 114, titanium nitride layer 116, tungsten sub-region 118, oxide/dielectric sub-regions 120-122, substrate 124, silicon dioxide layer 212, and titanium nitride layer 310. Further, platinum layer 108, yttrium stabilized zirconium layer 110, CMO layer 112, platinum layer 114 form memory stack 126. In some examples, after titanium nitride layer 106 has been etched as described above, titanium nitride layer 310 remains. The upper level of platinum layer 108 provides etch stop 302 to etchant 308. In other examples, stack 100 and the above-described elements and processes may be varied in material, dimensions, configuration, implementation, and other aspects and are not limited to those shown and described.

Figure 4A:
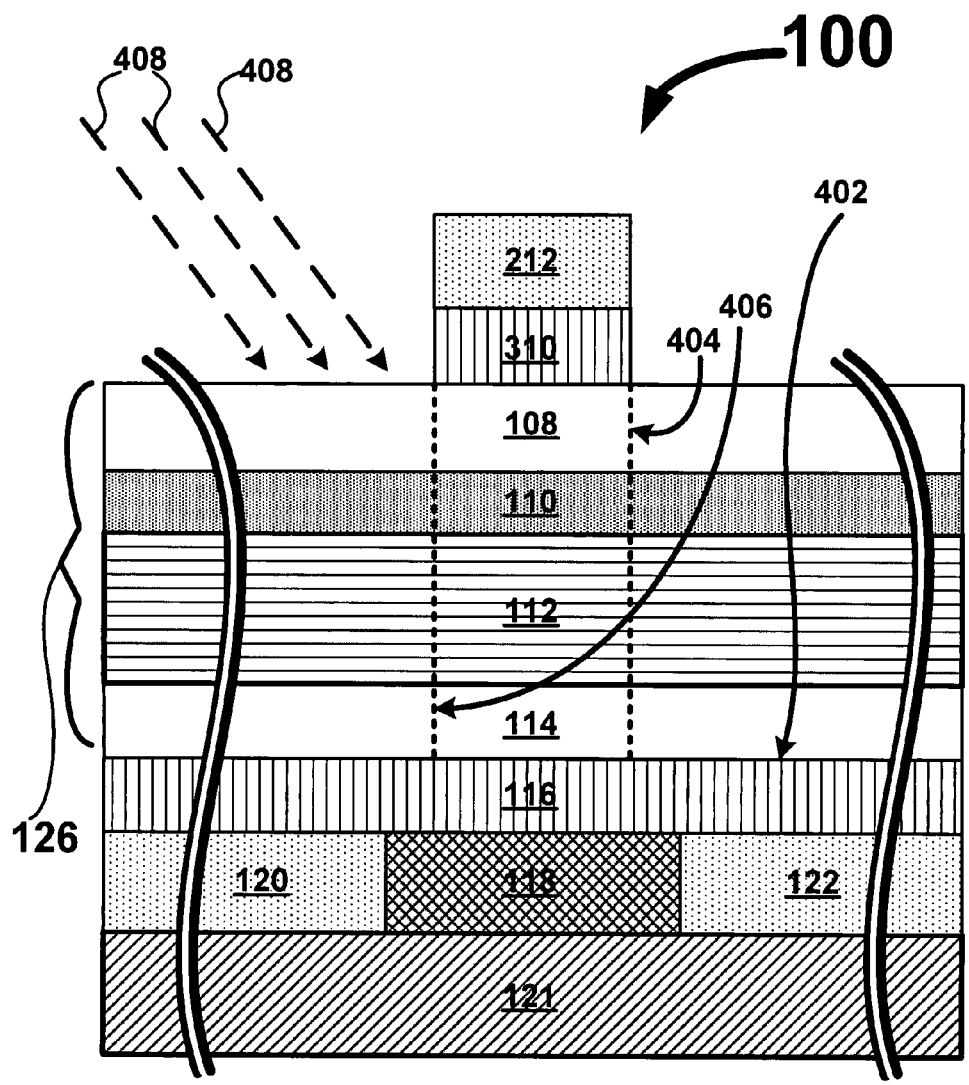
FIG. 4A is a cross-sectional view of a cross-point memory undergoing an exemplary etch of a memory stack in a selective etching process.
Figure 4B:
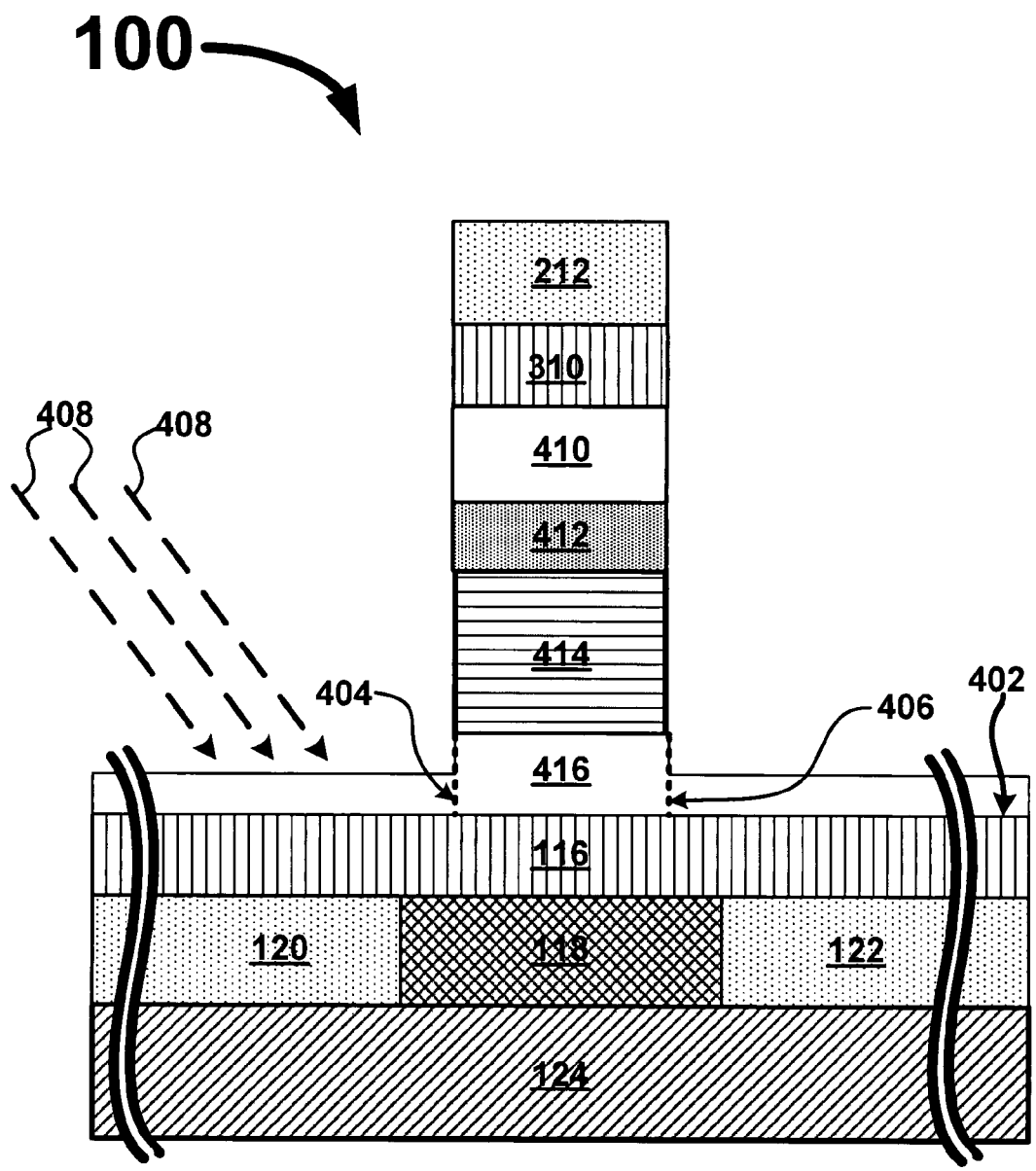
FIG. 4B is another cross-sectional view of a cross-point memory undergoing an exemplary etch of a memory stack in a selective etching process.
Figure 4C:
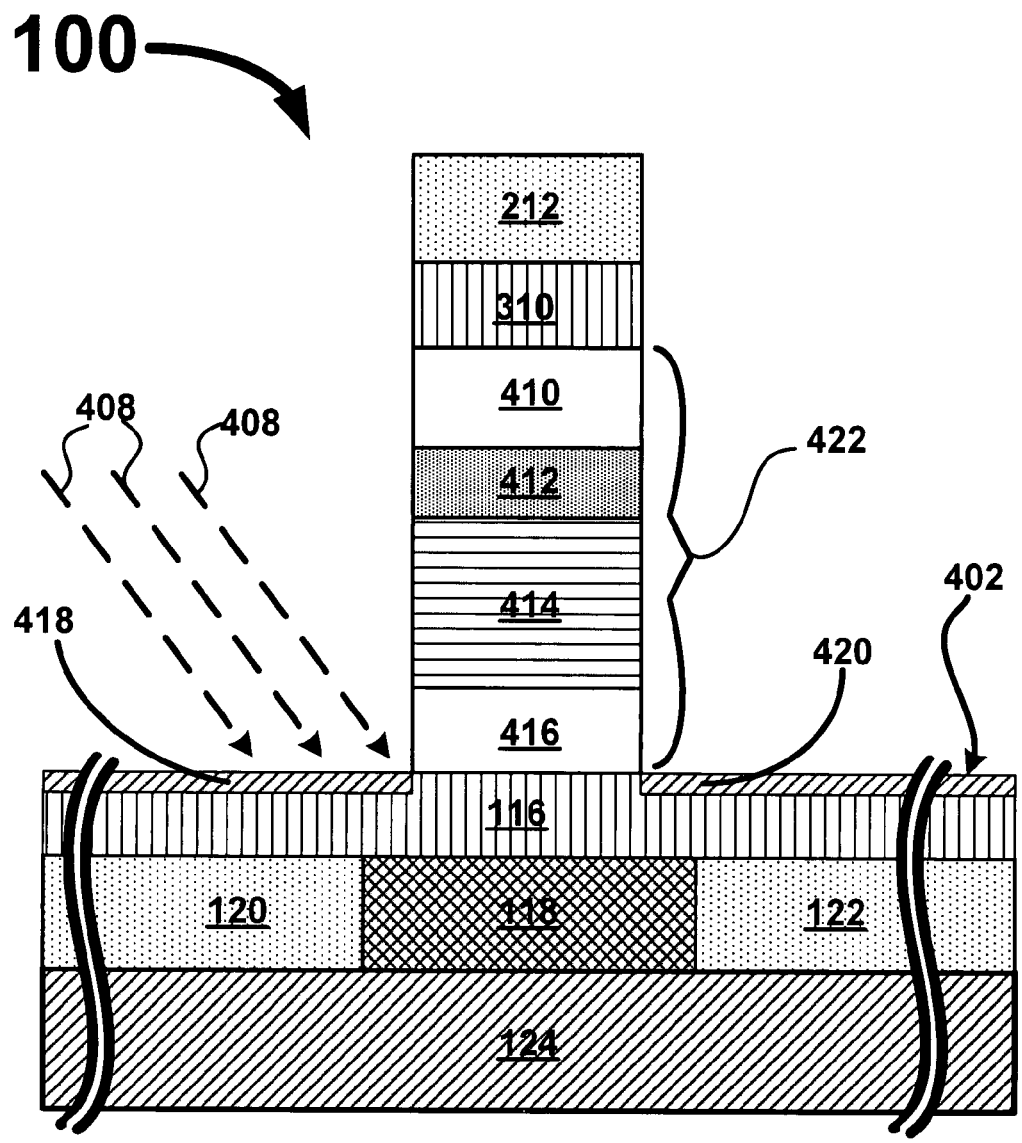
FIG. 4C is a cross-sectional view of a cross-point memory undergoing an exemplary etch of a memory stack in a selective etching process.
Figure 4D:
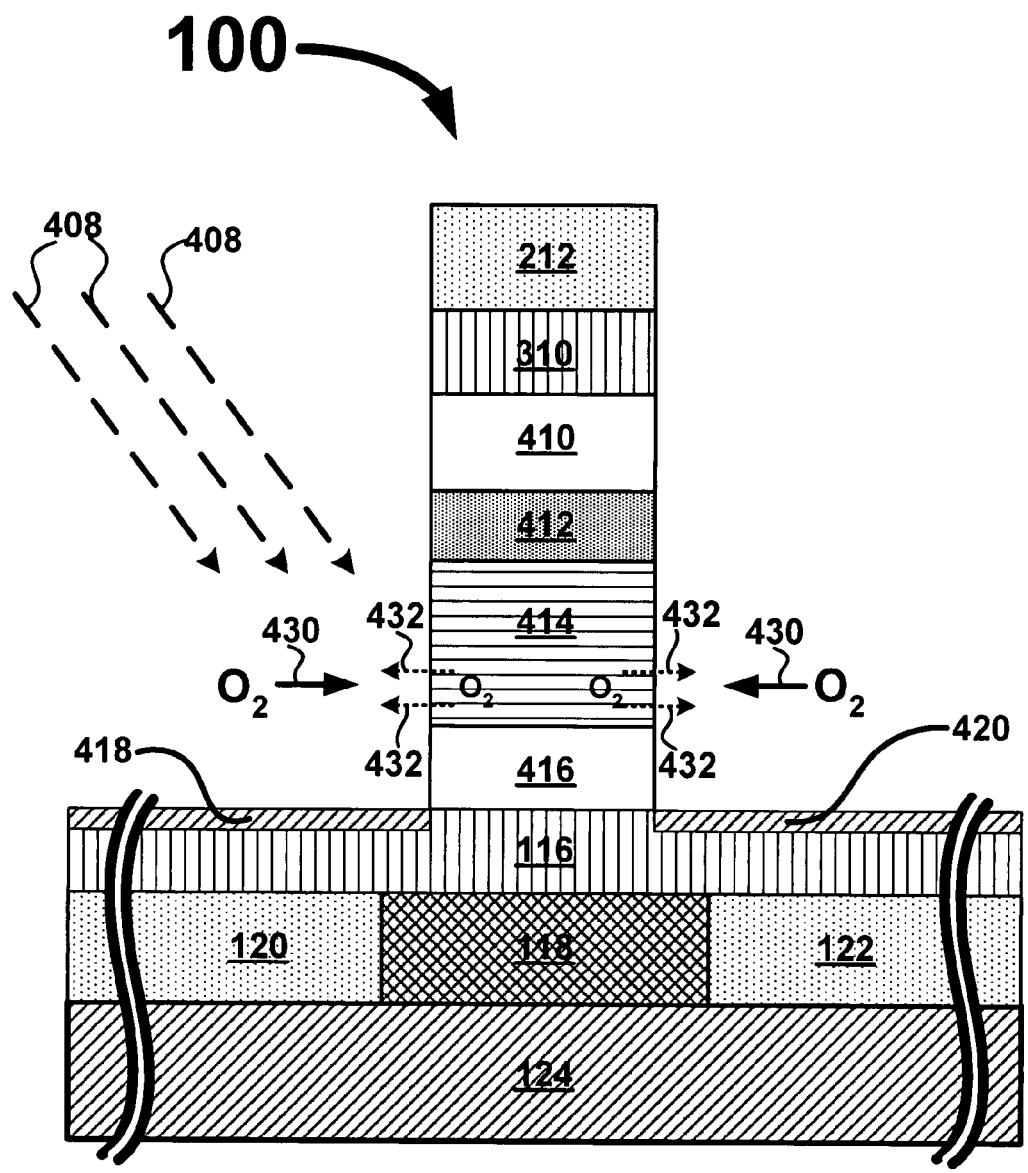
FIG. 4D is a cross-sectional view of a cross-point memory undergoing an exemplary etch of a memory stack preventing oxygen out-diffusion in a selective etching process.

FIG. 4A is a cross-sectional view of a cross-point memory undergoing an exemplary etch of a memory stack in a selective etching process. Here, stack 100 includes platinum layer 108, yttrium stabilized zirconium layer 110, CMO layer 112, platinum layer 114, titanium nitride layer 116, tungsten sub-region 118, oxide/dielectric sub-regions 120-122, substrate 124, silicon dioxide layer 212, and titanium nitride layer 310. Further, platinum layer 108, yttrium stabilized zirconium layer 110, CMO layer 112, and platinum layer 114 form memory stack 126. Stack 100 may exhibit sloped (i.e., substantially vertical) walls or sides as indicated by the dotted lines of pattern 404-406 such that the base of the memory stack is wider than the top of the memory stack. In some examples, etchant 408, which may be a plasma etchant, is used to etch the unmasked region of memory stack 126 (e.g., platinum layer 108, yttrium stabilized zirconium layer 110, CMO layer 112, platinum layer 114), as outlined by pattern 404-406 and etch stop 402. As an example, etchant 408 may have an argon and oxygen ($Ar/O_2$) chemistry with a high selectivity to oxide layers (e.g., oxide/dielectric sub-regions 120-122). During the etching process, argon may be supplied at a flow rate of about 50 sccm. Further, oxygen may be supplied at a flow rate of about 3 sccm. Etchant 408 is provided at an etch pressure of about 2 milliTorr, a power of approximately 1100 W at high frequency and a power of approximately 250 W in low frequency for a duration of about 360 seconds and an etch temperature of about 30 degrees Celsius. The flow rates of argon and oxygen, etch pressure, power, frequency, and etch temperature may be varied according to design and is not limited to the examples described above. In some examples, a layer of titanium oxide (TiOx) may form when $O_2$ oxidizes titanium nitride (i.e., titanium nitride layer 116), acting as an etch stop to etchant 408, as shown in FIGS. 4B-4D. In other examples, stack 100 and the above-described elements and processes may be varied in material, dimensions, configuration, implementation, and other aspects and are not limited to those shown and described.

FIG. 4B is another cross-sectional view of a cross-point memory undergoing an exemplary etch of a memory stack in a selective etching process. Here, stack 100 includes titanium nitride layer 116, tungsten sub-region 118, oxide/dielectric sub-regions 120-122, substrate 124, silicon dioxide layer 212, titanium nitride layer 310, platinum layer 410, yttrium stabilized zirconium layer 412, CMO layer 414, and platinum layer 416. In some examples, platinum layer 410, yttrium stabilized zirconium layer 412, CMO layer 414, and platinum layer 416 form a memory stack (i.e., memory stack 126). Further, platinum layer 410, yttrium stabilized zirconium layer 412, CMO layer 414, and platinum layer 416 are etched from platinum layer 108, yttrium stabilized zirconium layer 110, CMO layer 112, and platinum layer 114 (FIG. 4A), as specified by pattern 404-406 and etch stop 402. Also shown is remnant platinum in platinum layer 416. In some examples, when titanium nitride layer 116 is exposed to etchant 408 (i.e., an argon/oxygen combination plasma), titanium oxide (TiOx), as shown in FIG. 4C. In other examples, stack 100 and the above-described elements and processes may be varied in material, dimensions, configuration, implementation, and other aspects and are not limited to those shown and described.

FIG. 4C is a cross-sectional view of a cross-point memory undergoing an exemplary etch of a memory stack in a selective etching process. Here, stack 100 includes titanium nitride layer 116, tungsten sub-region 118, oxide/dielectric sub-regions 120-122, substrate 124, silicon dioxide layer 212, titanium nitride layer 310, platinum layer 410, yttrium stabilized zirconium layer 412, CMO layer 414, platinum layer 416, and titanium oxide regions 418-420. In some examples, platinum layer 410, yttrium stabilized zirconium layer 412, CMO layer 414, and platinum layer 416 form memory stack 422. Further, memory stack 422 is etched from platinum layer 108, yttrium stabilized zirconium layer 110, CMO layer 112, platinum layer 114 (FIG. 4A), as specified by pattern 404-406 and etch stop 402, which corresponds substantially to the top of titanium oxide regions 418-420. As described above, titanium oxide regions 418-420 form when etchant 408 (i.e., argon/oxygen plasma etchant) is used to etch memory stack 422 (i.e., platinum layer 410, yttrium stabilized zirconium layer 412, CMO layer 414, and platinum layer 416). In other examples, stack 100 and the above-described elements and processes may be varied in material, dimensions, configuration, implementation, and other aspects, and are not limited to those shown and described.

FIG. 4D is a cross-sectional view of a cross-point memory undergoing an exemplary etch of a memory stack preventing oxygen out-diffusion in a selective etching process. Here, stack 100 includes titanium nitride layer 116, tungsten sub-region 118, oxide/dielectric sub-regions 120-122, substrate 124, silicon dioxide layer 212, titanium nitride layer 310, platinum layer 410, yttrium stabilized zirconium layer 412, CMO layer 414, platinum layer 416, and titanium oxide regions 418-420. Also shown is oxygen 430 introduced in etchant 408, which acts to prevent or reduce oxygen out-diffusion. Using a plasma etchant containing O2 prevents or reduces out-diffusion of oxygen 432 from CMO layer 414. In other examples, stack 100 and the above-described elements and processes may be varied in material, dimensions, configuration, implementation, and other aspects and are not limited to those shown and described.

Figure 5A:
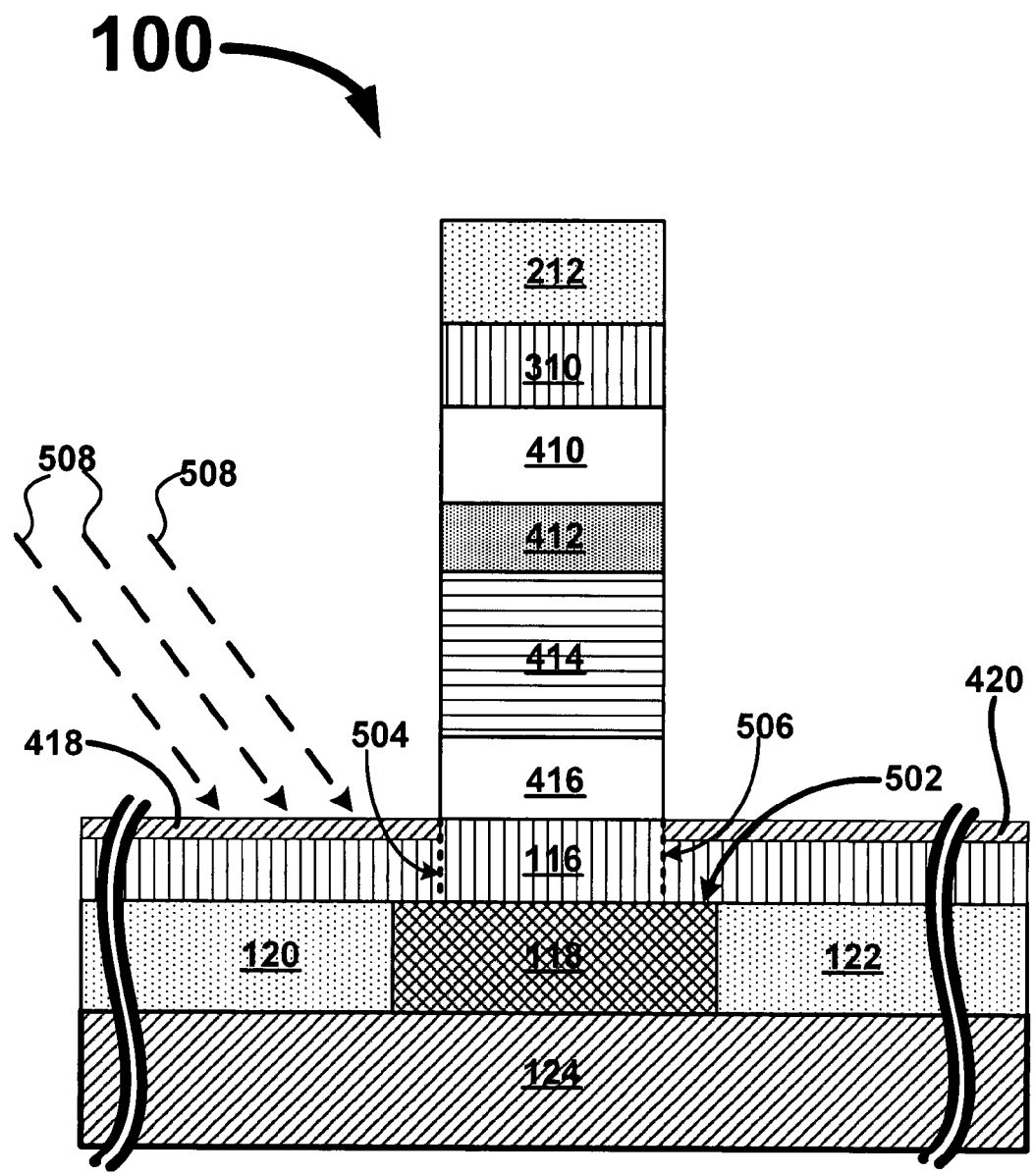
FIG. 5A is a cross-sectional view of a cross-point memory undergoing a further exemplary etch in a selective etching process.
Figure 5B:
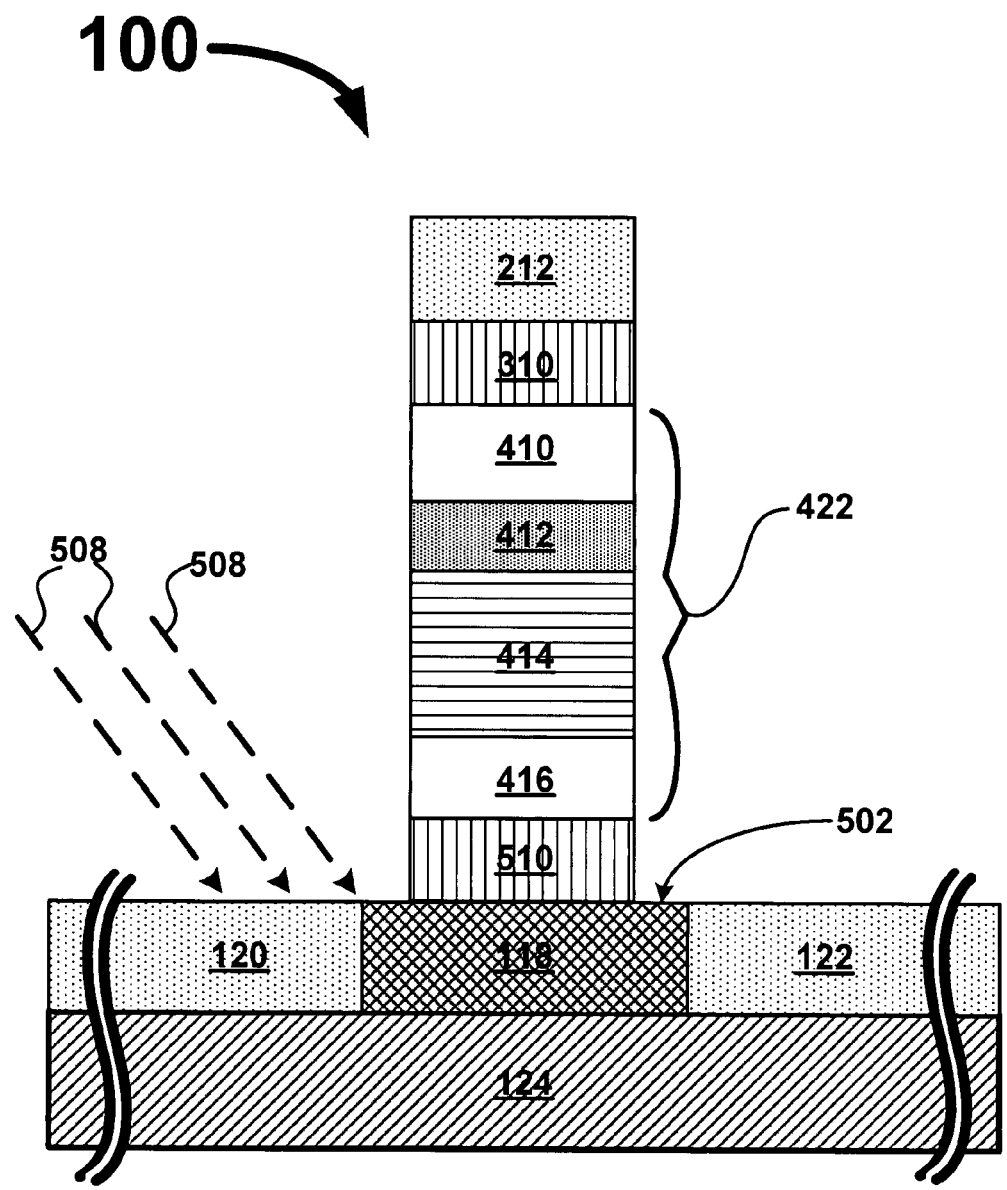
FIG. 5B is another cross-sectional view of a cross-point memory undergoing a further exemplary etch in a selective etching process.

FIG. 5A is a cross-sectional view of a cross-point memory undergoing a further exemplary etch in a selective etching process. Here, stack 100 includes titanium nitride layer 116, tungsten sub-region 118, oxide/dielectric sub-regions 120-122, substrate 124, silicon dioxide layer 212, titanium nitride layer 310, platinum layer 410, yttrium stabilized zirconium layer 412, CMO layer 414, platinum layer 416, and titanium oxide regions 418-420. Also shown is etch stop 502 (i.e., the lower layer of titanium nitride layer 116), pattern 504-506, and etchant 508. In some examples, a different plasma etchant other than those described above may be used to etch titanium oxide regions 418-420 and titanium nitride layer 116. As an example, etchant 508 may be HBr and Ar, $Cl_2$ and Ar, HBr, or $Cl_2$. The upper surface of tungsten layer sub-region 118 forms etch stop 502. Further, HBr may be supplied at a flow rate of about 50 sccm and argon is supplied at a flow rate of about 20 sccm. Etchant 508 is used in a plasma etch performed at, in some examples, a pressure of about 5 milliTorr, about 500 W at high frequency and about 50 W in high frequency, for a duration of approximately 30 seconds, and at an etch temperature of about 170 degrees Celsius. The flow rate and temperature of the above-described plasma etch may be varied and is not limited to the examples provided. The selective etch described above leaves the walls or sides of stack 100 substantially free of redeposited contaminants. An exemplary resulting structure after the completion of the fourth etch is shown in FIG. 5B. In other examples, stack 100 and the above-described elements and processes may be varied in material, dimensions, configuration, implementation, and other aspects and are not limited to those shown and described.

FIG. 5B is another cross-sectional view of a cross-point memory undergoing a further exemplary etch in a selective etching process. Here, stack 100 includes tungsten sub-region 118, oxide/dielectric sub-regions 120-122, substrate 124, silicon dioxide layer 212, titanium nitride layer 310, platinum layer 410, yttrium stabilized zirconium layer 412, CMO layer 414, platinum layer 416, and titanium nitride layer 510. Also shown is etch stop 502 (i.e., the lower layer of titanium nitride layer 116) and etchant 508. Stack 100 illustrates the remaining masked portions of layer 102-116 after the above-described etchants (e.g., 210 (FIGS. 2A-2B), 308 (FIGS. 3A-3B), 408 (FIGS. 4A-4D), 508 (FIGS. 5A-5B)) have been applied. Here, etchant 508 has been used to remove titanium oxide regions 418-420 and unmasked portions of titanium nitride layer 116, leaving stack 100 and memory stack 422 as shown. In other examples, stack 100 and the above-described elements and processes may be varied in material, dimensions, configuration, implementation, and other aspects and are not limited to those shown and described.

Figure 6:
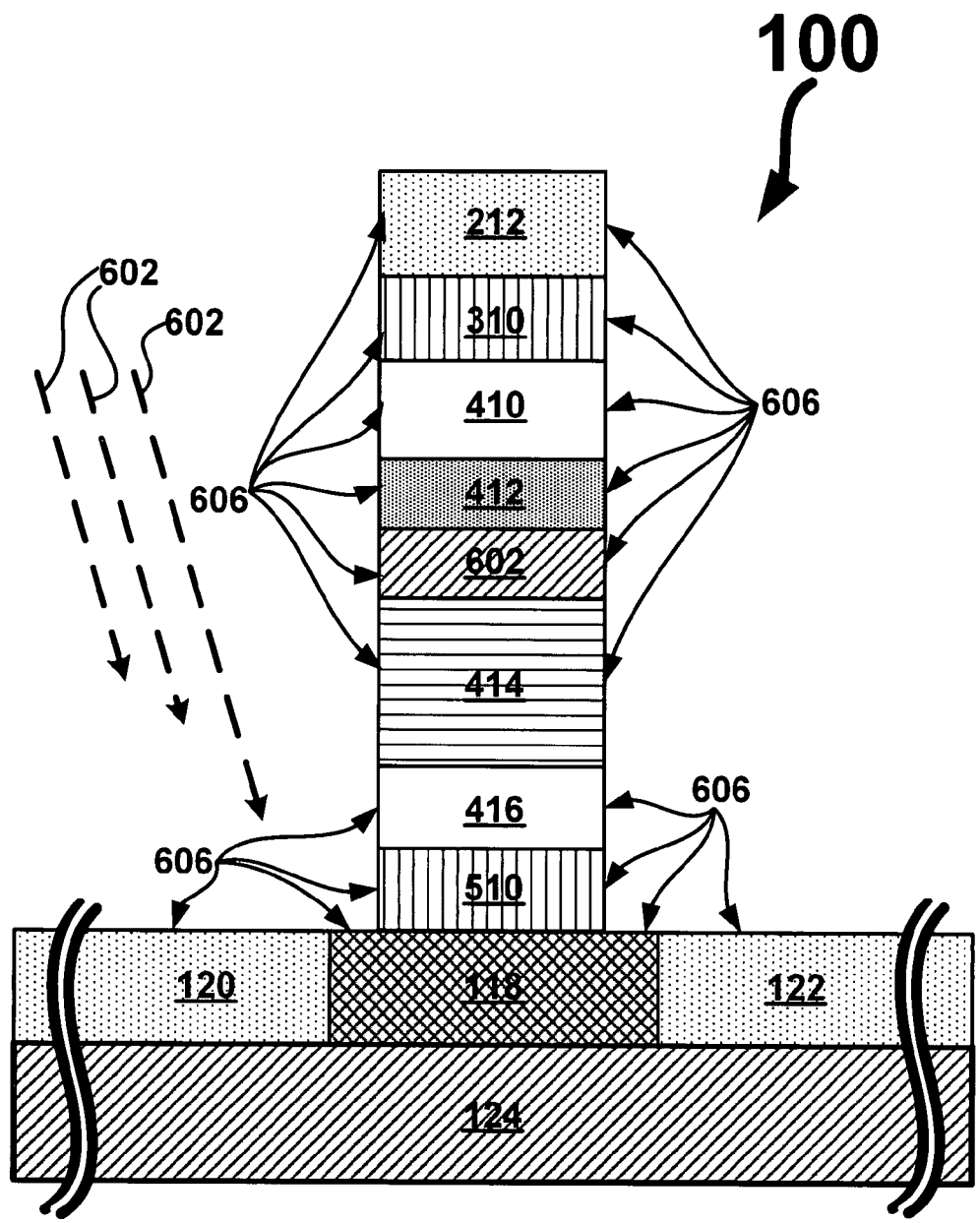
FIG. 6 is a cross-sectional view of a cross-point memory undergoing an exemplary anti-corrosion plasma treatment of a conductive metal oxide (CMO) layer in a selective etching process.

FIG. 6 is a cross-sectional view of a cross-point memory undergoing an exemplary anti-corrosion plasma treatment of a conductive metal oxide (CMO) layer in a selective etching process. Here, stack 100 includes tungsten sub-region 118, oxide/dielectric sub-regions 120-122, substrate 124, silicon dioxide layer 212, titanium nitride layer 310, platinum layer 410, yttrium stabilized zirconium layer 412, CMO layer 414, platinum layer 416, and titanium nitride layer 510. As shown, oxygen (i.e., $O_2$) 602 may be used to perform an anti-corrosion plasma treatment of CMO layer. In some examples, anti-corrosion plasma treatment may be performed in situ in a separate chamber of a cluster tool without breaking vacuum as stack 100 passes through different chambers. As commonly defined, a vacuum is any pressure that is less than atmospheric. Further, by providing oxygen at high pressures (e.g., 1 Torr) without breaking vacuum, corrosion of CMO layer 414 is prevented or reduced. Stack 100 does not come into contact with air, water (i.e., $H_2O$), or other ambient elements that may contain water particles, thus providing that there is substantially no corrosion of CMO layer 414 due to the reaction of halogens in situ combining with water particles on surfaces 606. As an example, the above-described plasma treatment may be performed by supplying oxygen at a flow rate of 1000 sccm, a pressure of approximately 1 Torr, a power of 800 W at high frequency (as described above), for a duration of 300 seconds at a temperature of 250 degrees Celsius. Further, nitrogen ($N_2$) may also be included to perform the anti-corrosion plasma treatment described above. In some examples, nitrogen may be provided at a flow rate of 100 sccm while using the other above-described parameters (e.g., oxygen flow rate of 1000 sccm, 1 Torr of chamber pressure, power of 800 W at high frequency, for 300 seconds at 250 degrees). Further, the above-described parameters, including the flow rates of oxygen and nitrogen and the plasma temperature may be varied and are not limited to the examples provided. In other examples, stack 100 and the above-described elements and processes may be varied in material, dimensions, configuration, implementation, and other aspects and are not limited to those shown and described.

Figure 7A:
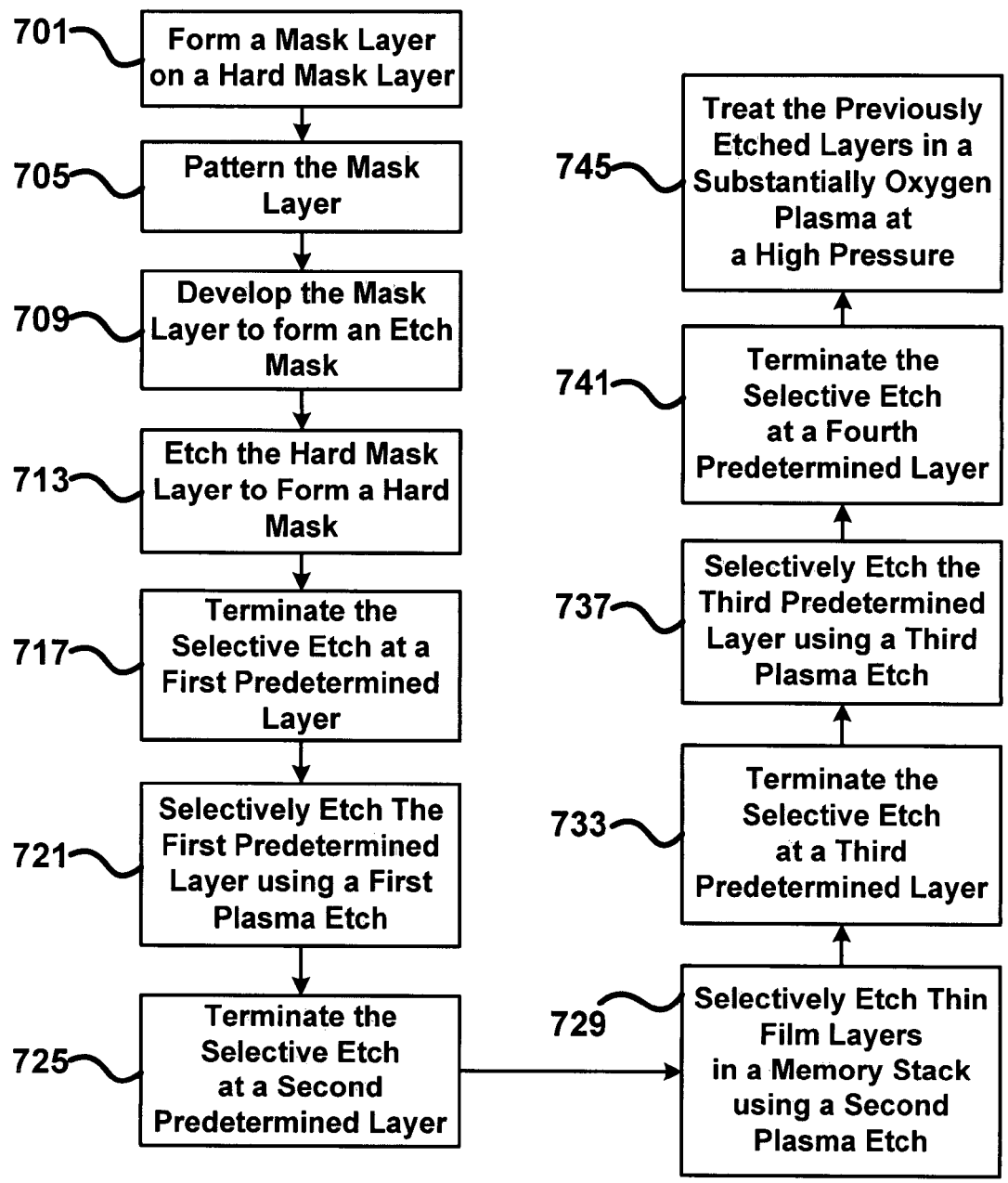
FIG. 7A is an exemplary process for selective etching.

FIG. 7A is an exemplary process for selective etching. Here, a mask layer is formed on a hard mask layer (701). In some examples, a mask layer may refer to a photoresist layer, such as that described above. Once formed, the mask layer is patterned (705). The mask layer is developed to form an etch mask (709). After forming the etch mask, the hard mask layer is selectively etched to form a hard mask (713). The selective etch used to form the hard mask (713) is terminated at a first predetermined layer (717). A further selective etch is performed on the first predetermined layer using a first etch plasma (721). The select etch of the first predetermined layer is terminated at a second predetermined layer (725). A further selective etch is performed on thin-film layers in a memory stack using a second plasma etch (729). The selective etch of the thin-film layers in a memory stack is terminated at a third predetermined layer (733). Yet another selective etch is performed on the third predetermined layer using a third plasma etch (737). The selective etch of the third predetermined layer is terminated at a fourth predetermined layer (741). Further, the previously etched layers are treated using a plasma including oxygen, which is introduced into a vacuum chamber at a high pressure (about 1 Torr) without breaking vacuum as the wafer (e.g., substrate 124 (FIGS. 1A-6)) passes from one chamber to another in, for example, a cluster tool (745). In some examples, nitrogen may also be introduced into a chamber during the plasma treatment of the previously etched layers, as described above. In other examples, the above-described process may be varied in design, order, or function, without limitation to the examples provided above.

Figure 7B:
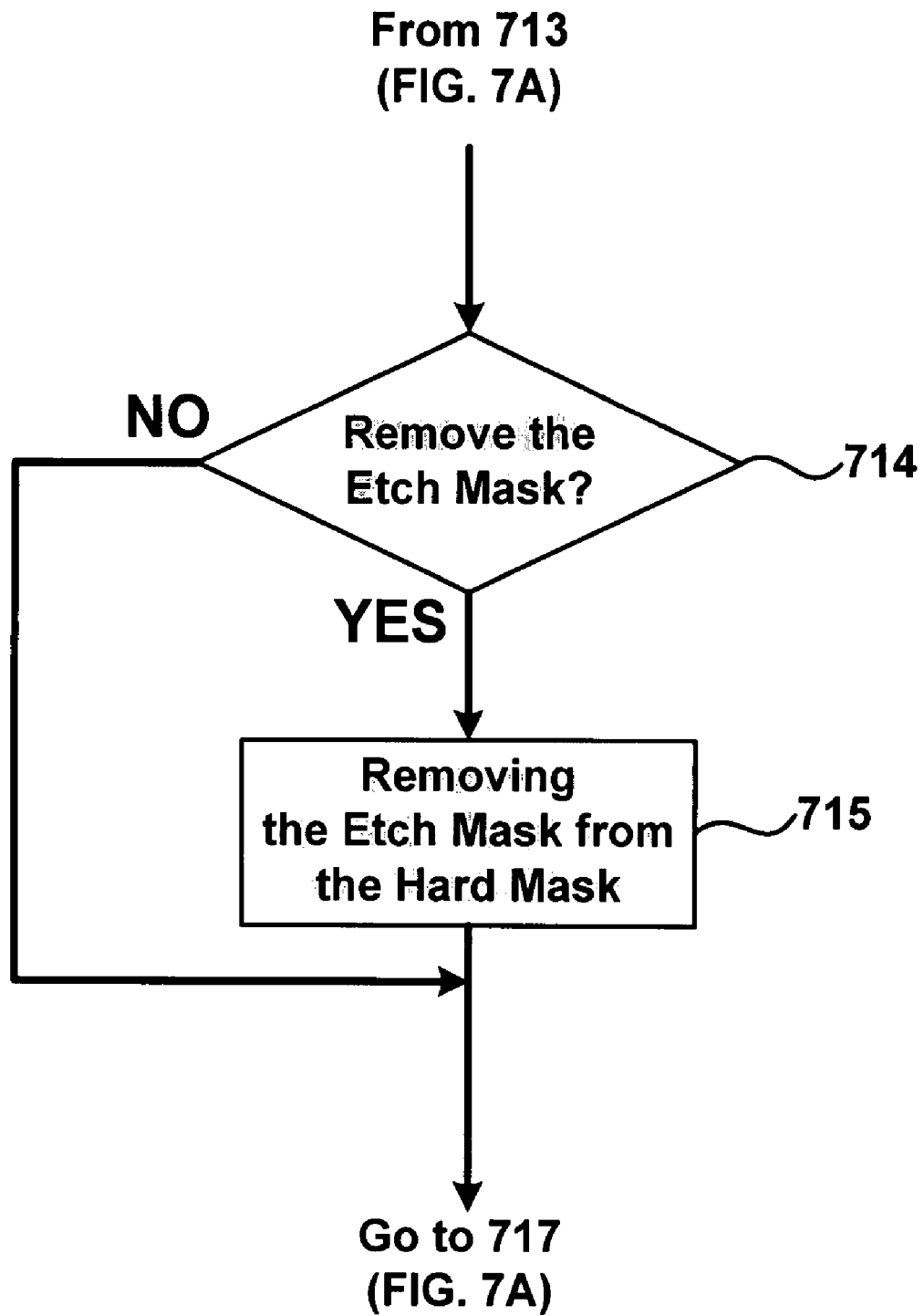
FIG. 7B is an exemplary process for optionally removing an etch mask from a hard mask.

FIG. 7B is an exemplary process for optionally removing an etch mask from a hard mask. Here, a determination may be made as to whether to remove an etch mask (e.g., photoresist layer 102 (FIGS. 2B-3A)) (714). If a determination is made to remove the etch mask after the hard mask has been etched, then the etch mask is removed from the hard mask using techniques such as ashing or stripping (e.g., wet and dry stripping), as described above (715). If a determination is made to not remove the etch mask, then the process ends and resumes with terminating the selective etch at a first predetermined layer (717). In other examples, the above-described process may be varied in design, order, or function, without limitation to the examples provided above.

The foregoing examples have been described in some detail for purposes of clarity of understanding, but are not limited to the details provided. There are many alternative ways and techniques for implementation. The disclosed examples are illustrative and not intended to be restrictive to the examples and details provided.

What is claimed:

1. A selective etching method, comprising:
    forming a stack comprising a plurality of layers using a thin film material that includes at least one layer that can be oxidized, the plurality of layers comprising a masked region and an unmasked region, wherein two or more of the plurality of layers are used to form a memory stack; and
    etching the unmasked region of the plurality of layers, the plurality of layers being exposed to a temperature and a pressure, wherein the unmasked region of the plurality of layers is etched under vacuum using an etchant comprising an inert gas and oxygen, wherein the etchant oxidizes the at least one layer that can be oxidized such that the etching stops.

2. The selective etching method of claim 1, wherein at least one layer that can be oxidized comprises titanium nitride.

3. The selective etching method of claim 1, wherein the masked region uses silicon dioxide as a mask.

4. The selective etching method of claim 1, wherein at least one of the plurality of layers comprises a material selected from the group consisting of platinum, yttrium stabilized zirconium, and a conductive metal oxide.

5. The selective etching method of claim 1, further comprising performing a plasma treatment to prevent corrosion of at least one of the one or more layers, wherein the at least one of the one or more layers comprises a conductive metal oxide and the plasma treatment comprises supplying a gas comprising oxygen to the stack without breaking the vacuum.

6. The method of claim 5, wherein preventing corrosion occurs in a chamber configured to prevent water particles from combining with a halogen gas and contacting an external surface of the stack.

7. The method of claim 5, wherein preventing corrosion of the at least one of the plurality of layers further comprises supplying oxygen to the stack at a flow rate of 1000 sccm, at approximately 1 Torr, at substantially 250 degrees Celsius, using RF power of substantially 800 watts at a high frequency to produce and sustain another etchant, for substantially 300 seconds.

8. The method of claim 5, wherein preventing corrosion of the at least one of the plurality of layers further comprises supplying nitrogen at a flow rate of 100 sccm at approximately 1 Torr, at substantially 250 degrees Celsius, and using RF power of substantially 800 watts at a high frequency for substantially 300 seconds.

9. The selective etching method of claim 1, wherein the masked region includes a photoresistive material over silicon dioxide coupled to the plurality of layers including a titanium nitride layer coupled to a platinum layer coupled to a yttrium stabilized zirconium layer coupled to a conductive metal oxide layer coupled to a platinum layer coupled to a titanium nitride layer.

10. The method of claim 1, wherein the etching of the unmasked region of the plurality of layers includes using a first etchant prior to the etchant comprising inert gas and oxygen, the first etchant having no oxygen.

11. The method of claim 10, wherein the plurality of layers includes at least two layers that can be oxidized, and wherein the first etchant is used to etch through the first layer that can be oxidized.

12. The method of claim 10, wherein the first etchant includes an inert gas and chlorine.

13. The method of claim 1, wherein the etchant comprising an inert gas and oxygen further comprises a halogen containing species.

14. The method of claim 1, further comprising etching the memory stack, wherein the pressure is less than approximately 10 milliTorr.

15. The method of claim , wherein the exposed temperature is below 250 degrees Celsius.

16. The method of claim 1, wherein the exposed temperature is below 50 degrees Celsius.

17. The method of claim 1, further comprising etching the memory stack using RF power of substantially 1100 watts at a high frequency to produce and to sustain the etchant.

18. The method of claim 1 further comprising etching the memory stack using RF power of substantially 250 watts at a low frequency to produce and to sustain the etchant.

19. A method, comprising:
etching an unmasked region associated with each layer of a plurality of layers, the plurality of layers comprising a stack, wherein the unmasked region of each of the plurality of layers is etched while exposed to a temperature, a pressure, a vacuum, using a plurality of etchants, wherein at least one of the plurality of etchants comprises an inert gas and oxygen, the plurality of etchants leaving substantially unaffected a masked region associated with each layer of the plurality of layers, wherein two or more of the plurality of layers comprises a memory stack; and
wherein the etchant comprising inert gas and oxygen ceases etching when it comes into contact with a layer of material within the plurality of layers, whereby the layer of material forms an oxide when it comes into contact with the etchant.

20. The method of claim 19, wherein the at least one of the plurality of layers comprises titanium nitride and one of the plurality of etchants comprises Argon and a halogen containing species and is used to etch the unmasked portion of the at least one of the plurality of layers comprising titanium nitride.

21. The method of claim 20, wherein the halogen containing species is selected from the group consisting of HBr, $Cl_2$, and $BCl3$.

22. The method of claim 19, wherein the memory stack comprises a first layer formed using platinum and deposited over a second layer comprising yttrium stabilized zirconium coupled to a third layer comprising the conductive metal oxide, and coupled to a fourth layer comprising platinum.

23. The method of claim 22, wherein the unmasked region of each layer of the memory stack is etched using at least one of the plurality of etchants comprising argon and oxygen supplied at less than approximately 10 milliTorr using power provided at or between substantially 250 watts to 1100 watts for approximately 360 seconds at about 30 degrees Celsius.

* * * * *

UNITED STATES PATENT AND TRADEMARK OFFICE
CERTIFICATE OF CORRECTION

PATENT NO.       : 7,618,894 B2                                    Page 1 of 1
APPLICATION NO.  : 11/881475
DATED            : November 17, 2009
INVENTOR(S)      : Bornstein et al.

It is certified that error appears in the above-identified patent and that said Letters Patent is hereby corrected as shown below:

1. In Column 11, Line 20, please Replace the word "claim" with the word "claim 1".

2. In Column 12, Line 25, after the word "comprising" please Replace the word "the" with the word "a".

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,618,894 B2 | Page 1 of 1 |
| APPLICATION NO. | : 11/881475 | |
| DATED | : November 17, 2009 | |
| INVENTOR(S) | : Bornstein et al. | |

It is certified that error appears in the above-identified patent and that said Letters Patent is hereby corrected as shown below:

1. On the Title page of the patent in INID code (75),

Please replace inventor name "Travis Byonghyop" with "Travis Byonghyop Oh".

2. In Claim 2, Column 10, Line 32, after the word "wherein",

Please insert the word --the--.

3. In Claim 13, Column 11, Line 15, before the word "inert",

Please replace the word "an" with the word "the".

Signed and Sealed this

Twenty-second Day of June, 2010

David J. Kappos
*Director of the United States Patent and Trademark Office*